(12) United States Patent
Yanagida et al.

(10) Patent No.: US 7,692,988 B2
(45) Date of Patent: Apr. 6, 2010

(54) SEMICONDUCTOR DEVICE AND METHOD OF CONTROLLING THE SAME

(75) Inventors: Takao Yanagida, Kanagawa (JP); Takuya Hirota, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 90 days.

(21) Appl. No.: 12/168,986

(22) Filed: Jul. 8, 2008

(65) Prior Publication Data
US 2009/0016123 A1    Jan. 15, 2009

(30) Foreign Application Priority Data
Jul. 9, 2007    (JP)    ............... 2007-179365

(51) Int. Cl.
*G11C 7/00*    (2006.01)
(52) U.S. Cl. .................. 365/203; 365/190; 365/202
(58) Field of Classification Search .................. 365/203
See application file for complete search history.

(56) References Cited

U.S. PATENT DOCUMENTS

| | | | |
|---|---|---|---|
| 6,205,071 B1 * | 3/2001 | Ooishi | 365/207 |
| 6,310,808 B1 * | 10/2001 | Tanizaki | 365/203 |
| 2009/0089493 A1 * | 4/2009 | Ikeda et al. | 711/105 |

FOREIGN PATENT DOCUMENTS

JP    2001-202782    7/2001

\* cited by examiner

*Primary Examiner*—Son L Mai
(74) *Attorney, Agent, or Firm*—Young & Thompson

(57) ABSTRACT

A semiconductor device (DRAM) according to one embodiment of the present invention includes a plurality of pairs of digit lines (digit True, Not) connected to a memory cell, a common signal line pair (main I/O True, Not) connected to the plurality of pairs of digit lines in common, a main I/O equalizer performing precharge of the common signal line pair, and a control circuit determining whether the precharge operation is continued irrespective of a signal level of a mask signal input from an outside.

8 Claims, 8 Drawing Sheets

SEMICONDUCTOR DEVICE AND METHOD OF CONTROLLING THE SAME

BACKGROUND OF THE INVENTION

1. Field of the Invention

The present invention relates to a semiconductor device, and more specifically, to a Dynamic Random Access Memory (DRAM) capable of performing a mask write operation.

2. Description of Related Art

In a DRAM including a plurality of input and output terminals (hereinafter referred to as I/O terminals), writing may not be always performed for all the I/O terminals. In such a case, mask signals are input to the I/O terminals where the writing is not performed. In a cell array including a cell which corresponds to the I/O terminal receiving the mask signal, a main I/O pair may be precharged instead of writing. A precharge operation of the main I/O pair is controlled by a control circuit.

FIG. 7 is a circuit diagram of a related control circuit. In the control circuit, a mask On/Off signal, which is an internal signal of the control circuit, is generated according to a mask signal received from an outside of the control circuit. An address signal /ADV is input to one input terminal of an NAND circuit 82 through a buffer 81. A clock CLK is input to the other input terminal of the NAND circuit 82 through buffers 98 and 99. The signal output from the NAND circuit 82 is input to a register 84. A write enable signal /WE which is input from the outside is input to the register 84 through a buffer 85. In other words, the register 84 synchronizes the write enable signal /WE with the address signal /ADV to output the synchronized signal to a pulse generator 86. The pulse generator 86 sets a pulse width of the generated pulse signal in accordance with the output of the register 84. The pulse generator 86 outputs this signal which will be output later as a write amplifier enable 2 signal. The signal output from the pulse generator 86 is input to one input terminal of an NAND circuit 88 through a mask determination waiting delay circuit 87.

The mask signal input from the outside is input to a register 93 through buffers 91 and 92. The register 93 synchronizes the mask signal with the clock CLK received through the buffers 98 and 99, and outputs the synchronized mask signal. The signal output from the register 93 is output to the other input terminal of the NAND circuit 88 through buffers 94, 95, and 96. The signal as the write amplifier enable 2 signal is output from the NAND circuit 88 through a buffer 89. The write amplifier enable 2 is a control signal for a write amplifier to be active.

The signal output from the register 84 is input to one input terminal of the NAND circuit 97, and the signal output from the register 93 is input to the other input terminal of the NAND circuit 97 through the buffers 94 and 95. The output of the NAND circuit 97 is output as a mask On/Off signal in the chip. The precharge signal generated in the chip is output to a pulse generator 100. The pulse generator 100 generates a pulse signal (control signal Pre) in accordance with the signal level of the precharge signal, and outputs this pulse signal to one input terminal of an NAND circuit 102 through a mask determination waiting delay circuit 101. The mask On/Off signal is input to the other input terminal of an NAND circuit 102. The signal output from the NAND circuit 102 is input to one input terminal of an NAND circuit 103. A chip select signal /CS is input to the other input terminal of the NAND circuit 103 through a delay element group 104 and a buffer 105. The output of the NAND circuit 103 is an MIO precharge signal controlling precharge of the main I/O.

FIG. 8 is a timing chart of each control signal in a related DRAM. In FIG. 8, one cycle (from A' to C) indicates a writing cycle for each one bit. The mask signal input from the outside is input (updated) for each one cycle. In FIG. 8, the writing operation is performed in periods I, II, and III, and the mask operation is performed in a period IV. In the related DRAM, the mask On/Off signal is monitored before the precharge operation, as shown in the period A' of the cycle 4. The control circuit determines whether the precharge operation is to be started in accordance with a signal level (H/L) of the monitored mask On/Off signal.

Such a DRAM is also disclosed in Japanese Unexamined Patent Application Publication No. 2001-202782. In Japanese Unexamined Patent Application Publication No. 2001-202782, the semiconductor device comprises a write mask circuit, and the write mask circuit sets a write mask signal /WM (corresponding to the mask On/Off signal) which is asynchronous with an internal clock. A write driver receives the output of the write mask circuit, and precharges a pair of write data lines (paragraph 0036).

FIG. 9 is a timing chart showing a precharge operation of the main I/O of the DRAM disclosed in Japanese Unexamined Patent Application Publication No. 2001-202782. In FIG. 9, GLOW and /GLOW correspond to the main I/O pair. In the DRAM disclosed in Japanese Unexamined Patent Application Publication No. 2001-202782, the main I/O pair is separated into a common signal line GLOW for a write operation, and a common signal line pair GLOR for a read operation. In the periods from t1 to t1−1, from t2 to t2−1, and from t3 to t3−1, the write enable signal /WE is activated. After the write enable /WE is activated, the precharge control circuit outputs the write mask signal /WM to the GIO line write driver.

Such a DRAM is also disclosed in Japanese Unexamined Patent Application Publication Nos. 2000-132964 and 2003-196985, for example.

However, in the related DRAM, it is determined whether the precharge operation is to be started in accordance with the determination result of monitoring the signal level of the mask signal input from the outside. Accordingly, the control signal needs to be input to the cell after the determination of the mask signal. In summary, in the related DRAM, the control signal needs to be delayed, which prevents high-speed operation.

In recent years, in a memory product such as a mobile SDRAM and a macro product where the mobile SDRAM is mounted, large capacity, high-speed operation, and low power consumption (low stand-by current) are strongly demanded. A refresh operation performed in the cell accounts for a large percentage of the stand-by current.

A period of the refresh operation needs to be set as long as possible in order to make the stand-by current lower. A restore level of the cell needs to be maximized in order to make the period of the refresh operation longer. However, when the start of the precharge operation delays such as in the related DRAM, it is impossible to secure enough time for the restore operation, which is performed after the precharge operation. Therefore, it is impossible to store enough charges in the cell, and the refresh period needs to be set short. On the other hand, when the restore level of the cell is set maximum, it is needed to secure enough time for the restore operation of the cell. Hence, the high-speed operation cannot be obtained. In summary, there is a trade-off relationship between the low stand-by current and the high operation speed. Accordingly, in the related DRAM, it is difficult to realize both high speed operation and the low stand-by current because of delaying of the start of the precharge operation.

SUMMARY

A semiconductor device according to one aspect of the present invention includes a plurality of pairs of digit lines connected to a memory cell, a common signal line pair connected to the plurality of pairs of digit lines in common, a common signal line equalizer performing precharge of the common signal line pair, and a control circuit starting the precharge of the common signal line pair irrespective of a signal level of a mask signal input from an outside, and determining whether the precharge is continued during the precharge of the common signal line pair based on the mask signal.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

The embodiment of the present invention will be described hereinafter in detail with reference to the accompanying drawings.

Figure 1:
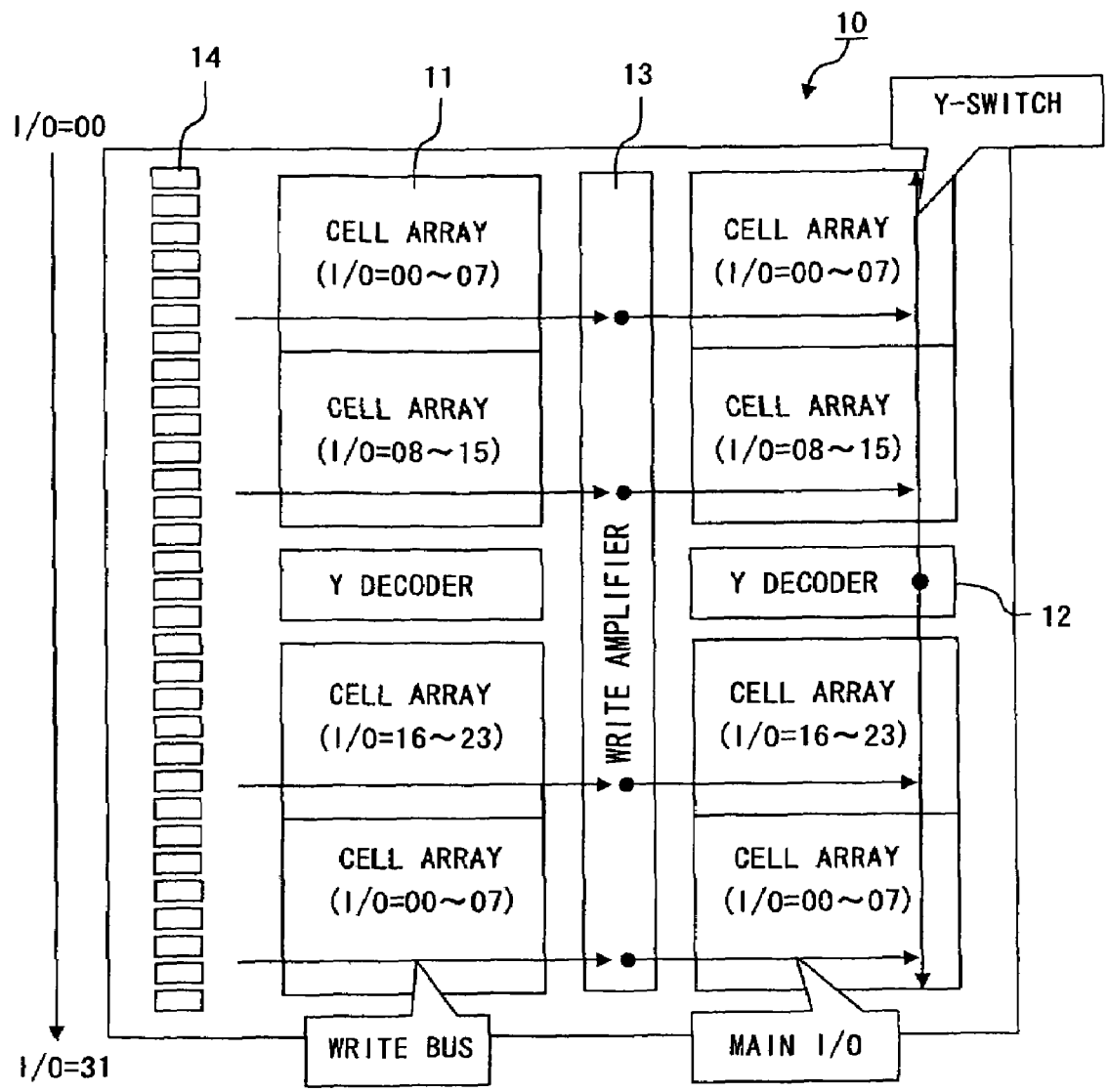
FIG. 1 is a cell array diagram showing an exemplary structure of a whole DRAM according to an embodiment of the present invention.

FIG. 1 is a cell array diagram showing an exemplary structure of a whole DRAM according to an embodiment of the present invention. The DRAM according to the present invention is not limited to the layout shown in FIG. 1, but the DRAM can have various layouts. As shown in FIG. 1, a DRAM 10 includes cell arrays 11, Y decoders 12, a write amplifier 13, and a plurality of I/O terminals 14. The DRAM 10 has a burst transfer function, which enables the memory data set having the predetermined burst length, to be input and output successively. The DRAM 10 also has a mask operation function, in which the cell array, where the data is not written, is precharged.

The cell array 11 includes a plurality of memory cells arranged in matrix, and a plurality of pairs of digit lines connected to the memory cells. Here, I/Os from 00 to 31 are divided into four groups and each group includes eight I/Os. One cell array 11 is configured to store one-byte data. A main I/O pair, which is a common signal line pair, is connected to the plurality of pairs of digit lines included in the cell array 11. In summary, the main I/O pair is connected for each one Byte. A Y-switch is provided between the main I/O pair and each digit line pair. The Y-switch controls the connection between the main I/O pair and the digit line pair. In the present embodiment, the main I/O performs as both the write data line and the read data line.

The Y decoder 12 performs decoding of a column address of the cell array 11. The Y decoder 12 drives the Y-switch in accordance with the address signal /ADV input from the outside, and connects the digit line pair connected to the memory cell corresponding to the selected address to the main I/O pair. The Y-switch selects the memory cell in a column direction, and selects each cell array (1 Byte) in one signal. When the Y-switch is in H level, the main I/O pair and the digit line pair are connected together.

The write amplifier 13 is activated by the control signal (write amplifier enable 2 signal) output from the control circuit 16 described later in detail. The write amplifier 13 amplifies the data input from the I/O terminal 14 through a write bus, and outputs the write data to the cell array 11 through the main I/O pair.

The I/O terminal 14 includes the I/Os from 00 to 31, and inputs and outputs data to and from the outside of the chip. When the write enable /WE received from the outside is active, the I/O terminal 14 inputs the write data. In the memory, the operation is performed for all I/O terminal 14 together. The mask signal enables operation for I/O terminal 14 to be active partly.

For example, when only the I/Os from 00 to 07 are set to be writing operation and the rest of I/Os from 08 to 31 maintain the status in which writing operation is not performed, the write data is input to the I/Os from 00 to 07, and the mask signal is input to the I/Os from 08 to 31. Accordingly, the data is written in the cell corresponding to the I/Os from 00 to 07 and the data is not written in the memory cell corresponding to the I/Os from 08 to 31.

Figure 2:
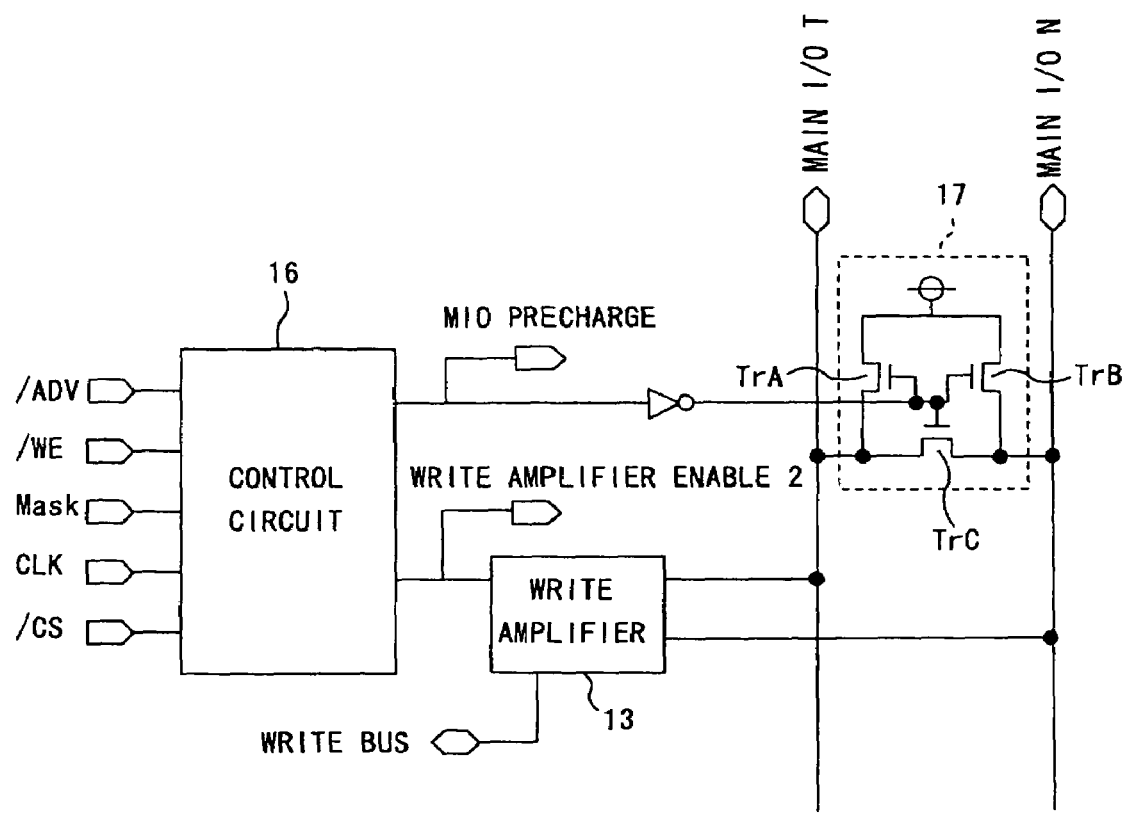
FIG. 2 is a partially enlarged diagram of the DRAM according to the embodiment of the present invention.

FIG. 2 is a partially enlarged diagram of the DRAM according to the embodiment of the present invention. Each of a control signal address signal /ADV, a write enable signal /WE, a mask signal Mask, a clock CLK, a chip select signal /CS or the like is input to the control circuit 16 from the outside. When the address signal /ADV is in the activation state, the signal input from the I/O terminal 14 is input as an address. When the write enable signal /WE is in the activation state, the signal input from the I/O terminal 14 is written into the memory cell 21. When the chip select signal /CS is in the activation state, the chip is selected.

The control circuit 16 generates the MIO precharge signal controlling the precharge operation from such a control signal. The MIO precharge signal is output to the main I/O equalizer 17 precharging the main I/O pair. The control circuit 16 generates the write amplifier enable 2 controlling a writing operation based on received the control signal. The write amplifier enable 2 is output to the write amplifier 13. In other words, the control circuit 16 controls each of the precharge operation of the main I/O equalizer 17 and the writing operation of the write amplifier 13. The control circuit 16 is separately provided for each cell array 11. In other words, the control circuit 16 is provided for each 1 Byte.

As described above, the write amplifier 13 is connected to the main I/O pair. In writing operation, the write amplifier 13 drives the main I/O based on data. The main I/O equalizer 17 is connected between two signal lines (main I/O True, Not), which is the main I/O pair. The main I/O equalizer 17 is activated by the MIO precharge signal, and performs precharge of the main I/O pair.

The main I/O equalizer 17 includes three transistors TrA, TrB, and TrC. The transistor TrA is connected between a power supply voltage and the main I/O True. The transistor TrB is connected between the power supply voltage and the main I/O Not. The transistor TrC is connected between the main I/O True and the main I/O Not. The MIO precharge signal is input to gates of the transistors TrA, TrB, and TrC through the buffer 18. Hence, the operation of the main I/O equalizer 17 is controlled by the MIO precharge signal. With such a structure, the precharge of the main I/O pair is performed for the cell array (Byte), where the data does not be written. This main I/O pair is connected to the plurality of pairs of digit lines.

Figure 3:
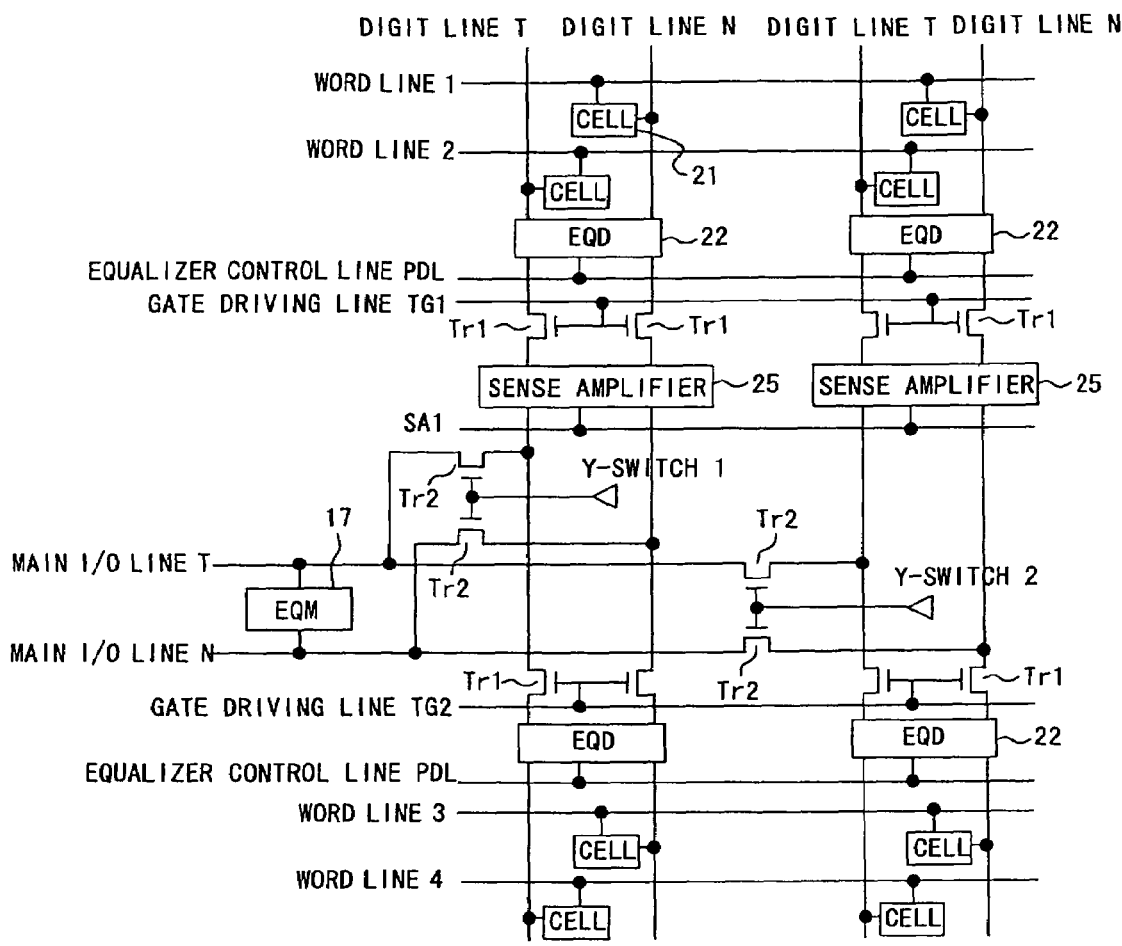
FIG. 3 is a partially enlarged diagram of the DRAM according to the embodiment of the present invention.

FIG. 3 is a partially enlarged diagram of the DRAM according to the embodiment of the present invention. The plurality of pairs of digit lines are connected to the main I/O pair in common. There is provided a transistor Tr2 between the digit line pair and the main I/O pair. The gate of the transistor Tr2 is connected to the Y-switch. The Y-switch selects the digit line pair connected to the main I/O pair. The main I/O pair comprises the two signal lines of True and Not. The main I/O equalizer 17 described above is connected between the signal line pair. The main I/O equalizer 17 precharges the main I/O pair according to the MIO precharge signal received from the control circuit 16.

The plurality of digit line pair and the word lines from 1 to 4 are arranged to be perpendicular to each other. The digit line pair comprises two signal line pair of True and Not (shown as T and N in the drawing). The H level of word line sets a gate transistor (not shown) in the memory cell 21 ON, and transmits potential of the digit line pair to the memory cell 21. On the other hand, in reading operation, the word line transmits the signal level held in the memory cell 21 to the digit line. Accordingly, the potential difference according to the signal level held in the memory cell 21 is generated in the digit line pair. When one signal line of the digit line pair is H level in reading or writing, the other signal line of the digit line pair is L level. According to the combination of the signal levels of the signal lines, 0 or 1 of the data can be determined.

The memory cell 21 is arranged around an intersection between the digit line pair and the word line. The memory cell 21 stores the data in accordance with the charge amount (H level/L level) stored in the capacitor. In the memory cell 21, refresh writing is performed at a predetermined interval. In this refresh writing, the charges are stored in the capacitor of the memory cell 21 to the restore level.

The digit equalizer 22 is connected between the two signal lines (the digit line pair). The digit equalizer 22 precharges the digit line pair. The precharge operation of the digit equalizer 22 is controlled by the digit precharge signal PDL. When the digit precharge signal PDL is H level, the digit equalizer 22 precharges the digit line pair to precharge voltage (VDD/2, for example). The digit equalizer 22 is set to be the L level in reading and writing.

One sense amplifier 25 is provided for one digit line pair. The memory cells 21 are up-down symmetrically arranged with respect to the sense amplifier 25. The transistors Tr1 are provided between the sense amplifier 25 and each memory cell 21. The connection between the sense amplifier 25 and the memory cell 21 is controlled by controlling ON/OFF of the transistor Tr1. A gate of the transistor Tr1 which is in an upper side of the drawing is connected to a gate driving line TG1. On the other hand, a gate of the transistor Tr which is in a lower side of the drawing is connected to a gate driving line TG2. By driving one of the gate driving lines TG1 and TG2, the sense amplifier 25 is connected to each of the memory cells 21.

In reading operation, the sense amplifier 25 is activated by the sense amplifier activation signal SA. When the sense amplifier 25 is activated by the sense amplifier activation signal SA, the sense amplifier 25 amplifies the potential difference of the digit line pair and outputs the signal to the main I/O pair.

Figure 4:
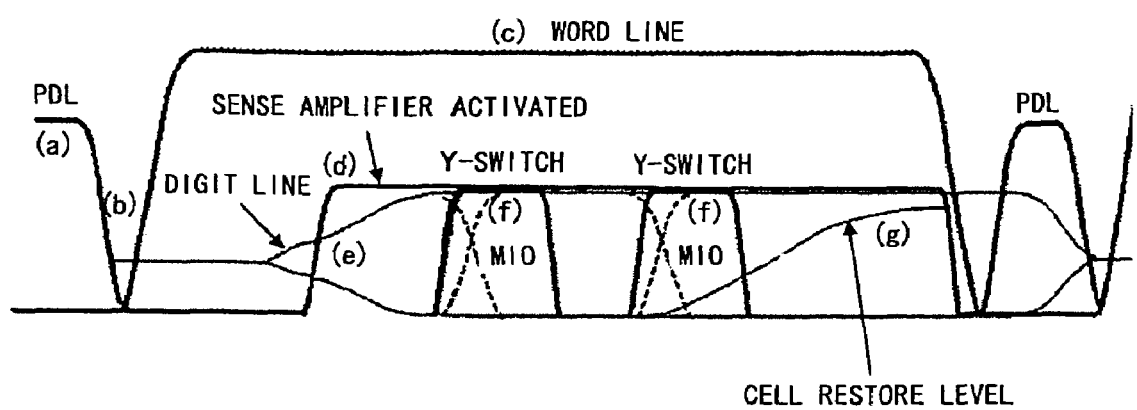
FIG. 4 is a wave diagram of each signal line showing a burst operation of the DRAM according to the embodiment of the present invention.

FIG. 4 is a wave diagram of each signal line showing a burst writing operation in the DRAM according to the embodiment of the present invention. In FIG. 4, writing is performed on the cell twice. First, the digit line precharge signal PDL controlling the precharge of the digit line pair is set to be H level (a). Thus, the digit line is precharged to the precharge voltage (VDD/2, for example) (b). Next, the word line is set to be H level (c). The gate transistor of the cell turns ON. In writing operation, the potential of the digit line is transmitted to the cell. In reading operation, the signal level held in the cell is transmitted to the digit line. The sense amplifier 22 is set to be activated (d). Thus the potential difference of the digit line pair is amplified by the sense amplifier 22 (e).

The Y-switch provided between the digit line pair and the main I/O pair turns ON (f). The digit line pair and the main I/O pair are connected. After the main I/O pair and the digit line pair are connected, the potential of the digit line pair changes in accordance with the signal level (write data) of the main I/O. Accordingly, the restored charged level in the cell changes (g). Note that the cell stores the charges in the H level.

Figure 5:
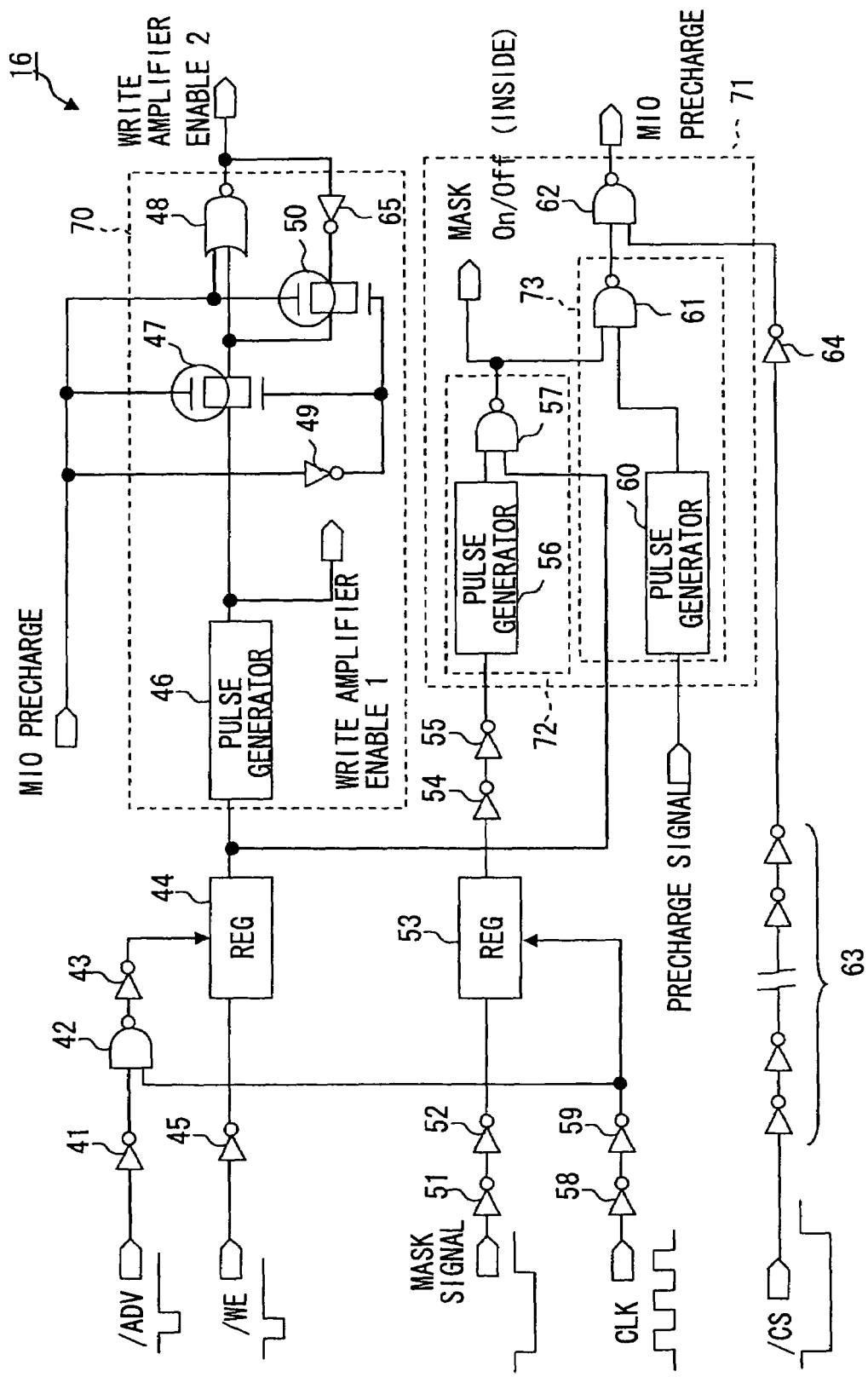
FIG. 5 is a circuit diagram showing an exemplary structure of a control circuit 16 according to the embodiment of the present invention.

FIG. 5 is a circuit diagram showing an exemplary structure of the control circuit 16 according to the embodiment of the present invention. The control circuit 16 includes a write amplifier enable generator 70 generating the write amplifier enable 2 based on the address signal /ADV and the write enable /WE. The control circuit 16 further includes an MIO precharge generator 71 generating the MIO precharge signal based on the precharge signal, the mask signal, and the clock CLK. The MIO precharge generator 71 further includes a mask On/Off generating circuit 72 generating the mask On/Off signal in the chip from the mask signal and the clock CLK. The MIO precharge generator 71 further includes an MIO precharge generating circuit 73 generating the MIO precharge signal from the precharge signal and the mask On/Off signal. The precharge signal is a control signal generated by a not shown refresh operation control circuit. Further, the mask On/Off signal is an internal mask signal generated based on the mask signal input from the outside.

The address signal /ADV is output to one input terminal of an NAND circuit 42 through a buffer 41. A clock CLK is input to the other input terminal of the NAND circuit 42 through buffers 58 and 59. The output of the NAND circuit 42 is output to a register 44 through a buffer 43. Therefore, the NAND circuit 42 outputs the address /ADV to the register 44 in accordance with the timing of the clock CLK.

The write enable signal /WE is output to the register 44 through a buffer 45. The register 44 synchronizes the write enable signal /WE with the received address signal /ADV, and outputs this write enable signal /WE to the write amplifier enable generator 70. The output of the register 44 is input to a pulse generator 46 of the write amplifier enable generator 70.

The write amplifier enable generator 70 includes a pulse generator 46, switching elements 47 and 50, and an NOR circuit 48. The output of the register 44, which is the write enable signal /WE, is input to the pulse generator 46. The pulse generator 46 sets the pulse width of the generated pulse signal in accordance with the signal level of the write enable signal /WE, and outputs this pulse signal as the write amplifier enable 1 signal. The write amplifier enable 1 is output to the NOR circuit 48 through the switching element 47.

The MIO precharge signal generated by the MIO precharge generator 71 described below is input to the other terminal of the NOR circuit 48. The output of the NOR circuit 48 is input again to one terminal of the NOR circuit 48 through a buffer 65. With such a structure, the output of the NOR circuit 48 is held. The output of the NOR circuit 48 is output to the write amplifier 13 as the write amplifier enable 2, which-controls the writing operation of the write amplifier 13.

On the other hand, the mask signal received from the outside is output to a register 53 through buffers 51 and 52. The clock CLK is also output to the register 53 through buffers 58 and 59. The register 53 outputs the mask signal to the mask On/Off generating circuit 72 in accordance with the timing of the clock CLK. The output of the register 53, which is the mask signal, is output to a pulse generator 56 of the mask On/Off generating circuit 72 through buffers 54 and 55. The pulse generator 56 changes a pulse width of the generated pulse signal in accordance with the signal level of the received mask signal through the register 53, and outputs this signal to an NAND circuit 57. The output of the register 44, which is the write enable signal /WE, is input to the other terminal of the NAND circuit 57. The output of the NAND circuit 57 is output as the mask On/Off signal in the chip.

The MIO precharge generating circuit 73 includes a pulse generator 60 and an NAND circuit 61. The precharge signal generated in the chip is input to the pulse generator 60. The pulse generator 60 converts the precharge signal into the pulse signal, and outputs the pulse signal to the NAND circuit 61. The output of the pulse generator 60 is input to one terminal of the NAND circuit 61, and the mask On/Off signal generated by the mask On/Off signal circuit 72 is input to the other terminal of the NAND circuit 61. The output of the NAND circuit 61 is output to one input terminal of an NAND circuit 62.

The output of the MIO precharge generating circuit 73 is input to one terminal of the NAND circuit 62, and the chip select signal /CS input from the outside is input to the other terminal of the NAND circuit 62. The NAND circuit 62 outputs the output of the MIO precharge generating circuit 73 as the MIO precharge signal when the chip select signal /CS is in the activation state. The chip select signal /CS is output to the NAND circuit 62 through the delay element group 63 and the buffer 64. The MIO precharge signal thus generated is output to the main I/O equalizer 17 precharging the main I/O.

Figure 6:
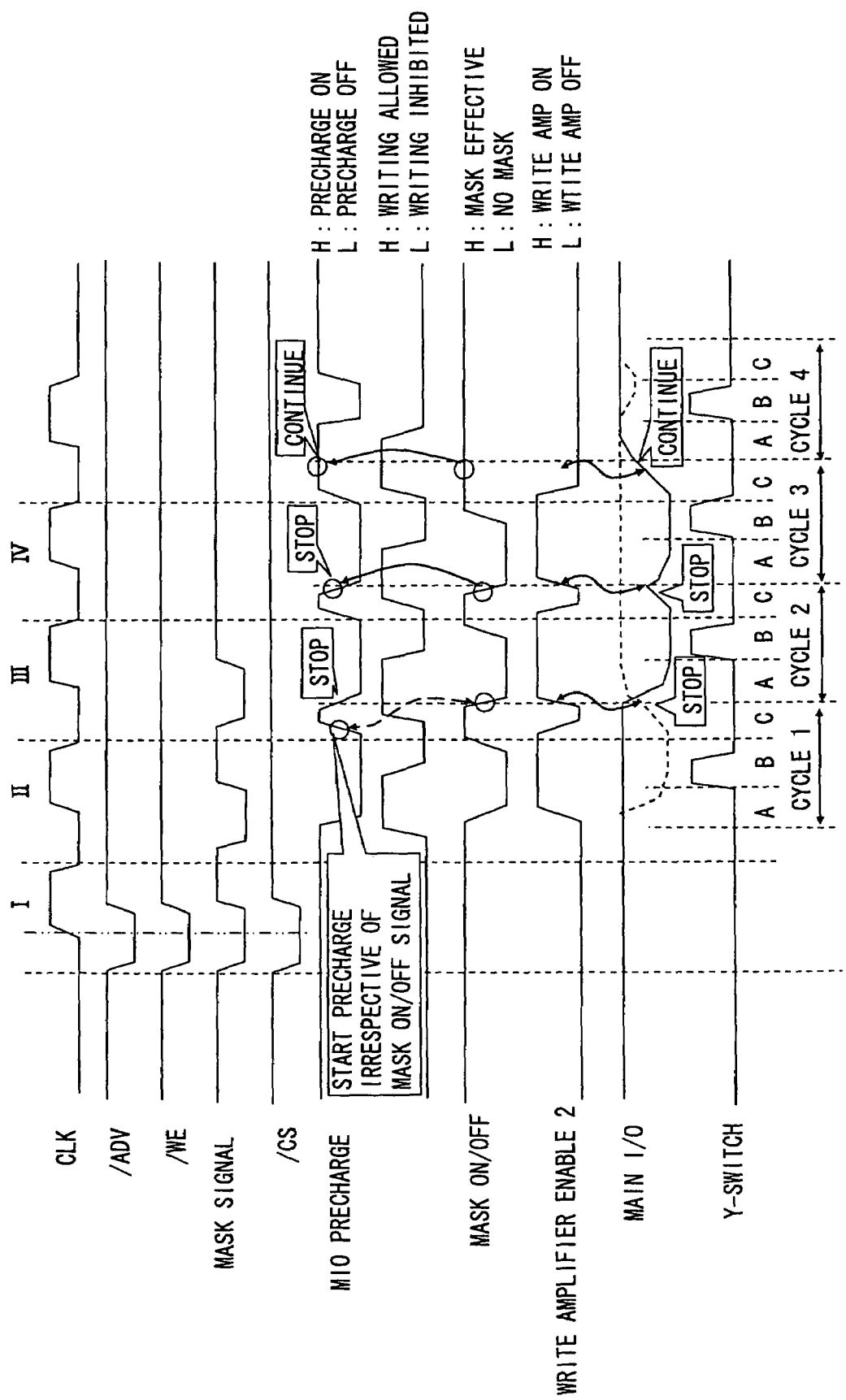
FIG. 6 is a timing chart showing an operation of the DRAM according to the present invention.
Figure 7:
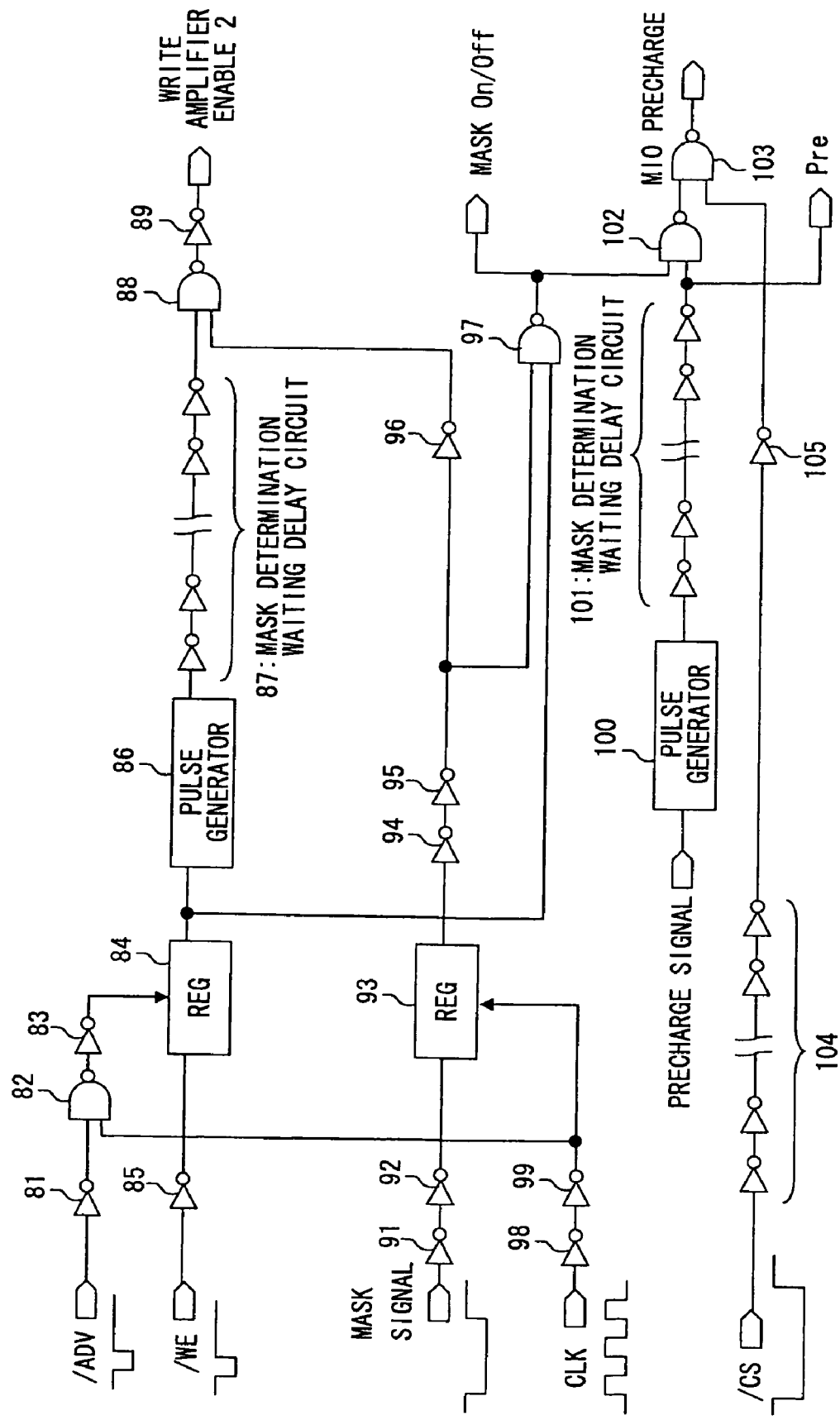
FIG. 7 is a circuit diagram showing a structure of a control circuit of a related DRAM.
Figure 8:
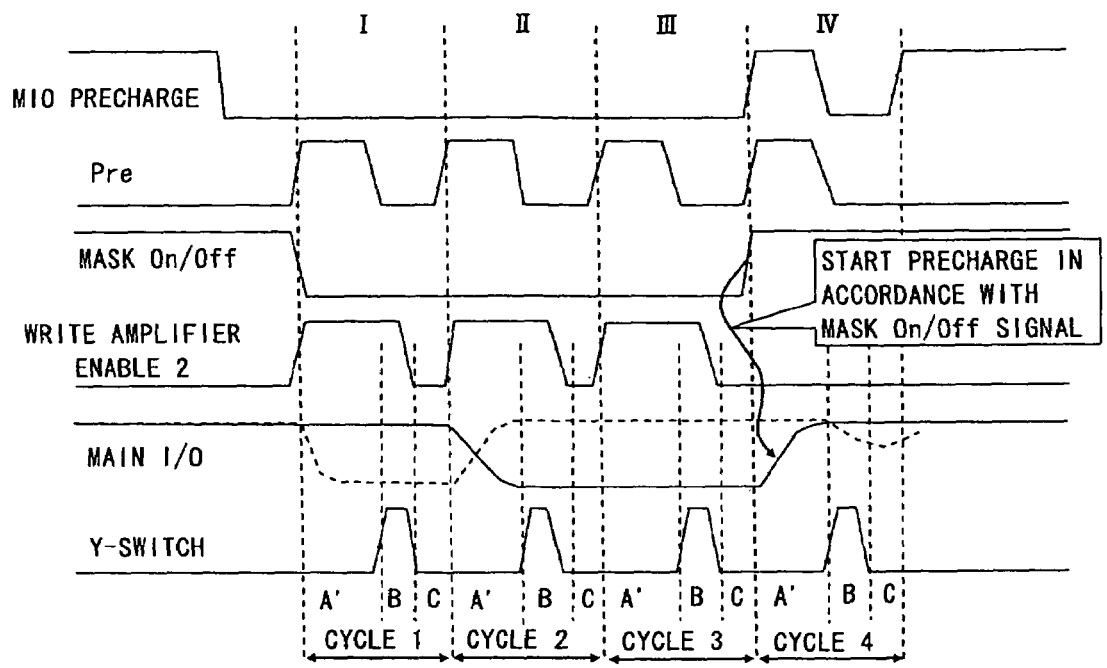
FIG. 8 is a timing chart showing each control signal generated by the control circuit in the related DRAM.
Figure 9:
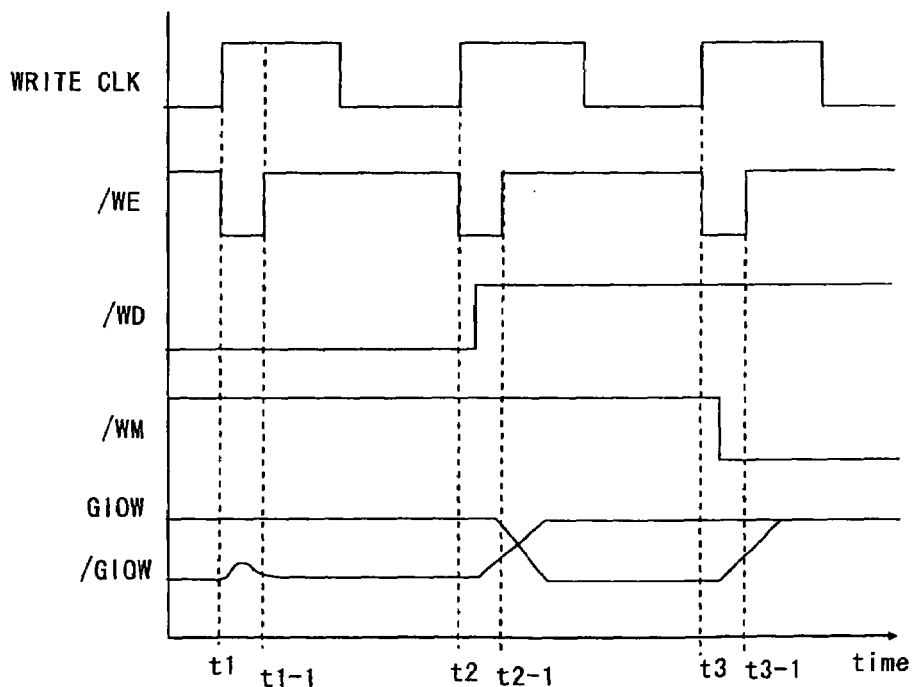
FIG. 9 is a timing chart showing an operation of a DRAM disclosed in Japanese Unexamined Patent Application Publication No. 2001-202782.

Now, the operation of the DRAM 10 thus configured will be described. FIG. 6 is a timing chart showing an operation of the DRAM according to the present invention. In FIG. 6, the clock /CLK, the address signal /ADV, the write enable signal /WE, the mask signal, and the chip select signal /CS are control signals input from the outside of the chip. The MIO precharge signal, the write amplifier enable 1 signal, the mask On/Off signal, and the write amplifier enable 2 signal are control signals generated by the control circuit 16 shown in FIG. 4. The MIO precharge signal, the write amplifier enable 1 signal, the mask On/Off signal, and the write amplifier enable 2 signal are common signals in one byte. On the other hand, the main I/O and the Y-switch are the control signals that are independent for each bit. Here, the signals of the address signal /ADV, the write enable signal /WE, and the chip select signal /CS that are input from the outside are taken in due to the rising of the clock /CLK (shown by two-dot chain lines in the drawing). In the periods I, II, and III in the drawing, the writing operation is performed. In the period IV, the mask operation is performed.

With a completion of the writing operation as a trigger, the MIO precharge signal turns the H level. Here, the precharge operation is executed when the MIO precharge signal is in the H level, and the precharge operation is stopped when it is in the L level. Therefore, the MIO precharge signal turns the H level trigged by the completion of the writing in the previous cycle, and the precharge of the main I/O pair is started. In other words, regardless of the signal level of the mask signal, the main I/O pair starts the precharge operation upon completion of writing. One cycle (periods A to C) indicates the period from completion of writing of one bit to completion of writing of a next bit. Note that FIG. 6 shows an operation for one bit. The writing operation or the mask operation is also performed for other bits (I/O) that are not shown. The write amplifier enable 1 is the signal obtained by converting the write enable signal /WE into the pulse signal by the pulse generator 46. The writing can be allowed in the H level, and is inhibited in the L level.

Now, each control signal when the writing operation is performed will be described. As shown in the period C in the cycle 2, the MIO precharge changes from the L level to the H level upon completion of the writing operation of the previous cycle 1. Thus the precharge operation is started. The mask On/Off signal is monitored during the precharge operation. When the mask On/Off signal falls down at the time of monitoring as shown in the period C of the cycle 2, the MIO precharge turns the L level from the H level. Accordingly, the precharge operation stops. On the other hand, the write amplifier enable 2 changes from the L level to the H level, and the write data is input to the main I/O.

Now, each control signal when the mask operation is performed will be described. As shown in the period C in the cycle 3, the MIO precharge changes from the L level to the H level upon completion of the writing operation of the previous cycle 2. Thus the precharge operation is started. The mask On/Off signal is monitored during the precharge operation. When the mask On/Off signal that is monitored is not falling at the time of monitoring such as in the period C of the cycle 3 (when the signal level does not change), the MIO precharge signal is kept to the H level. Accordingly, the precharge operation is continued.

In summary, according to the present embodiment, the precharge operation is started irrespective of the signal levels of the mask signal input from the outside or the mask On/Off signal generated inside. Then the mask On/Off signal is monitored during the precharge operation. If the signal level of the mask On/Off signal in monitoring is the L level, the precharge operation is stopped and the writing operation is performed. On the other hand, if the signal level is the H level, the precharge operation is continued and the mask operation is performed.

The DRAM 10 thus configured starts the precharge operation irrespective of the signal levels of the mask signal input from the outside or the mask On/Off signal generated inside. Accordingly, the waiting time of the determination result can be reduced compared with the related DRAM where the precharge is started after performing the determination of the mask signal, whereby the high-speed operation can be realized. Further, it is possible to store charges in the memory cell 21 to the maximum restore level by accelerating the start of the precharge operation. Accordingly, the refresh period can be made longer, and the stand-by current of the DRAM can be made lower. Hence, high-speed operation can be realized while keeping the stand-by current low.

In the related DRAM, the precharge operation is started after the signal level of the mask signal is determined. Therefore, other control signals are delayed in accordance with the timing of the start of the precharge operation. Therefore, there is a need to provide a plurality of delay elements to delay the control signals, which makes a circuit size large. On the other hand, since the precharge operation can be started irrespective of the signal level of the mask signal in the present embodiment, there is no need to provide a related delay element. Accordingly, it is made possible to make a circuit size smaller compared with the related DRAM.

Further, in the DRAM according to the present embodiment, the mask signal input from the outside is converted into the mask On/Off signal which is the pulse signal. By detecting rising (or falling) edge of the pulse signal, the signal level of the mask signal can easily be determined.

Further, it is preferable to apply the present embodiment to the DRAM including the burst operation function performing successive writing (reading) in synchronization with the clock. In the burst operation, the write data is successively input from the I/O terminal 14. If the precharge is performed after the determination of the mask signal such as in the related DRAM, the burst operation may be interrupted due to the determination waiting time of the mask signal. On the other hand, in the present embodiment, the precharge operation is started irrespective of the signal level of the mask signal. Then the signal level of the mask On/Off signal is determined during the precharge operation. Accordingly, even when the mask signal and the write data are alternately input for each written clock in the burst operation, there is no need to set the determination waiting time of the mask signal. Accordingly, the successive writing of the data can be made possible due to the burst operation.

It is apparent that the present invention is not limited to the above embodiment, but may be modified and changed without departing from the scope and spirit of the invention. The DRAM according to the present embodiment may have various structures and controlling methods as long as the DRAM includes a structure where the precharge is started without waiting for the mask signal received from the outside.

What is claimed is:

1. A semiconductor device comprising:
    a plurality of digit line pairs connected to a memory cell;
    a common signal line pair connected to the plurality of digit line pairs in common;
    a common signal line equalizer performing precharge of the common signal line pair; and
    a control circuit starting the precharge of the common signal line pair irrespective of a signal level of a mask signal received from an outside, and determining whether the precharge is continued based on the mask signal during the precharge of the common signal line pair.

2. The semiconductor device according to claim 1, wherein the control circuit includes a common signal line precharge signal generating circuit generating a common signal line precharge signal controlling the common signal line equalizer by setting a pulse width of a pulse signal generated by a pulse generator in accordance with the signal level of the mask signal.

3. The semiconductor device according to claim 1, further comprising a write amplifier driving write data in the common signal line pair, wherein
    the control circuit includes a write amplifier control signal generating circuit generating a write amplifier control signal controlling the write amplifier by setting a pulse width of a pulse signal generated by a pulse generator in accordance with a signal level of a write amplifier enable signal received from an outside.

4. The semiconductor device according to claim 1, wherein the semiconductor device is a DRAM performing a burst operation.

5. A method of controlling a semiconductor device comprising a plurality of digit line pairs connected to a memory cell, a common signal line pair connected to the plurality of digit line pairs in common, and a common signal line equalizer performing precharge of the common signal line pair, the method comprising:
    starting the precharge of the common signal line pair connected to a digit line pair in common irrespective of a signal level of a mask signal received from an outside; and
    determining whether the precharge is continued based on the mask signal during the precharge of the common signal line pair.

6. The method of controlling the semiconductor device according to claim 5, wherein it is determined whether the precharge of the common signal line pair is continued or not based on an internal mask signal, whose a pulse width is set in accordance with the signal level of the mask signal.

7. The method of controlling the semiconductor device according to claim 5, wherein the precharge is started with a trigger of completion of writing of the digit line.

8. The method of controlling the semiconductor device according to claim 5, wherein the semiconductor device is a DRAM performing a burst operation.

* * * * *